United States Patent
Meroth et al.

(10) Patent No.: US 6,737,991 B1
(45) Date of Patent: May 18, 2004

(54) METHOD AND DEVICE FOR COMPRESSING AND DECOMPRESSING DATA

(75) Inventors: Ansgar Meroth, Reutlingen (DE); Thomas Geisler, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/031,631

(22) PCT Filed: May 5, 2000

(86) PCT No.: PCT/DE00/01411

§ 371 (c)(1), (2), (4) Date: Apr. 9, 2002

(87) PCT Pub. No.: WO00/69179

PCT Pub. Date: Nov. 16, 2000

(30) Foreign Application Priority Data

May 7, 1999 (DE) .......................... 199 21 298

(51) Int. Cl.$^7$ ................................. H03M 7/38
(52) U.S. Cl. ............................ 341/51; 341/50
(58) Field of Search ..................... 341/50, 51, 67

(56) References Cited

U.S. PATENT DOCUMENTS

| 4,586,027 A | 4/1986 | Tsukiyama et al. |
| 4,872,009 A | 10/1989 | Tsukiyama et al. |
| 4,937,681 A | 6/1990 | Fujinawa et al. |
| 5,805,932 A | * 9/1998 | Kawashima et al. ........ 395/888 |
| 5,894,588 A | * 4/1999 | Kawashima et al. ........ 395/888 |

FOREIGN PATENT DOCUMENTS

| DE | 37 42 098 | 6/1988 |
| EP | 0 372 970 A1 | 6/1990 |
| EP | 0 766 469 A | 4/1997 |
| EP | 0 810 532 | 12/1997 |
| WO | 86/01660 | 3/1986 |
| WO | 96 11546 A | 4/1996 |

OTHER PUBLICATIONS

"Data Compression" Techniques and Applications Hardware and Software Considerations by Gilbert Held, A Wiley Heyden Publication, John Wiley & Sons, pp. 26–33., 1983.

* cited by examiner

Primary Examiner—Michael Tokar
Assistant Examiner—Joseph Lauture
(74) Attorney, Agent, or Firm—Michael J. Striker (57) ABSTRACT

A method is proposed for compressing a sequence of data elements and for decompressing it, which is used for loss-free, storage space-saving compression. In this connection, the data elements are stored in a compressed or uncompressed form depending on the correlation with preceding or subsequent data elements in the data element sequence. In particular, the method is used for the display in a freely programmable combination instrument in a motor vehicle. The data to be compressed are in particular image data.

13 Claims, 5 Drawing Sheets

METHOD AND DEVICE FOR COMPRESSING AND DECOMPRESSING DATA

BACKGROUND OF THE INVENTION

The invention is based on a method for compressing data. In the run-length encoding method (RLE method), a method for data compression is already known in which no data loss occurs. This method is used for example with so-called PCX data. The aim of the method is to combine repeating data elements and to store them along with the number of repetitions. If the data elements are bytes made up of eight bits, then the compression occurs in such a way that bytes up to a value of 63 which do not repeat are stored uncompressed; the two highest bits must have the value 0. Bytes with a value between 64 and 255, as well as bytes between zero and 63 which repeat, are stored encoded in a data element made up of two bytes. In the first byte in this instance, the highest two bits are set equal to one. The subsequent bits indicate the repetition factor for the second byte. In this method, it is disadvantageous that for individual bytes with a value between 64 and 255, the storage space requirement is doubled. In an unfavorable case, compression using the RLE method can result in the required storage space being greater after compression than before compression. Also known for a data compression is the Lempel-Ziv algorithm, in which a data sequence to be compressed is tested for repetitions of partial sequences, repeating elements are stored in a code table, and the partial sequences are replaced by an assigned code symbol. A table of an unknown size must be set up for the decompression.

SUMMARY OF THE INVENTION

The method according to the invention, has the advantage over the prior art that the information as to whether a data element is stored in a compressed or uncompressed form is stored in another additional data element. This makes it possible to use the compression method according to the invention for all data elements, independent of their value, since no additional compression information must be contained in the individual data elements themselves. It is also advantageous to embody the compression as dependent upon preceding and subsequent data elements, since this permits a particularly effective compression.

It is particularly advantageous that multiple identical data elements that repeat in sequence with one another are counted and stored with a repetition factor in the manner according to the invention. The repetition factor can then assume a maximal value of the data element since the information as to whether the data element is stored in a compressed or uncompressed form is stored in a different data element. It is also advantageous to store the compressed or uncompressed data elements in a storage region provided for this and to store the data element, which contains the information as to which data elements have been stored in a compressed or uncompressed form, in a different storage region since this storage permits an effective access to the data elements. With sequences of data elements which exceed a predeterminable size, it is also advantageous to execute a storage in different data packets. As a result, even graphics which require a great deal of storage space can be broken dow into data packets whose size, for example, is optimally adapted to the sector size of a data storage medium or the data packet size is adapted for transmission via an interface or via the Internet, es.g. via e-mail.

It is also particularly advantageous to provide a method for decompression of the data elements which have been compressed according to the invention. The decompression method here has the advantage that the data elements stored in a first region contain information as to which of the data elements stored in the second region are stored in a compressed or uncompressed form. A simpler processing of the data in comparison to the prior art is thus possible because for example with the RLE method for PCX data, it is not possible for their to be a separation of this kind and the information as to whether a data element is stored in a compressed or uncompressed form is stored directly with this data element.

It is also advantageous to execute a decompression of a number of data packets connected to one another since this permits the data sequence extracted from the data packets to be arbitrary in size.

It is also advantageous to use the above-mentioned method preferably for compressing and decompressing image data. For decompression, it is advantageous to provide a device which is connected to a calculating unit and a display device. The decompression method, which is rapid and favorable in terms of required storage space, makes it possible to read information stored in a storage unit, where for example the storage unit is a part of the calculating unit, by means of a decompression unit and to display it with the aid of the display device. A particularly advantageous application is to provide the decompression device for a freely programmable combination instrument in a motor vehicle. Because in particular for the instrument display in a motor vehicle, a graphic depiction with the simplest structure possible must be chosen, if only for the sake of clarity. As a result of this simple structure of the image data to be displayed, repetitions of identical image elements and therefore also repetitions of identical data elements are particularly frequent. The compression and decompression method according to the invention can therefore be used in a particularly efficient manner. As a result, both the storage space requirement and the costs that it involves can be reduced for a freely programmable combination instrument. Furthermore, a relatively slow storage device is generally used for storing images in a freely programmable combination instrument. But with highly compressed images, the storage access time has significantly less effect than with images which are stored in an uncompressed form. With a sufficiently high processing speed and a slow storage device, compressed images can therefore be displayed faster than uncompressed images because these uncompressed images require a greater storage region.

It is also advantageous that a single bit is selected as a base element and determines whether a data element is stored in a compressed or uncompressed form. As a result, in the worst case scenario, the data quantity is only increased by one bit per uncompressed data element. By contrast, in the RLE method for PCX data mentioned in the prior art, an increase in the data quantity by one byte. i.e. by eight bits, occurs when data elements are stored in an uncompressed form. A temporary storage, e.g. in the form of a code table of the kind required with the Lempel-Ziv algorithm, is not required. Two registers are sufficient for the decompression: a first register for a data element to be decompressed and a second register for the data element which contains the information as to whether the data element in the first register is stored in a compressed form. An additional volatile memory is not required.

BRIEF DESCRIPTION OF THE DRAWINGS

Exemplary embodiments of the invention are shown in the drawings and will be explained in detail in the subsequent description.

DESCRIPTION OF THE PREFERRED EMBODIMENTS

Figure 1:
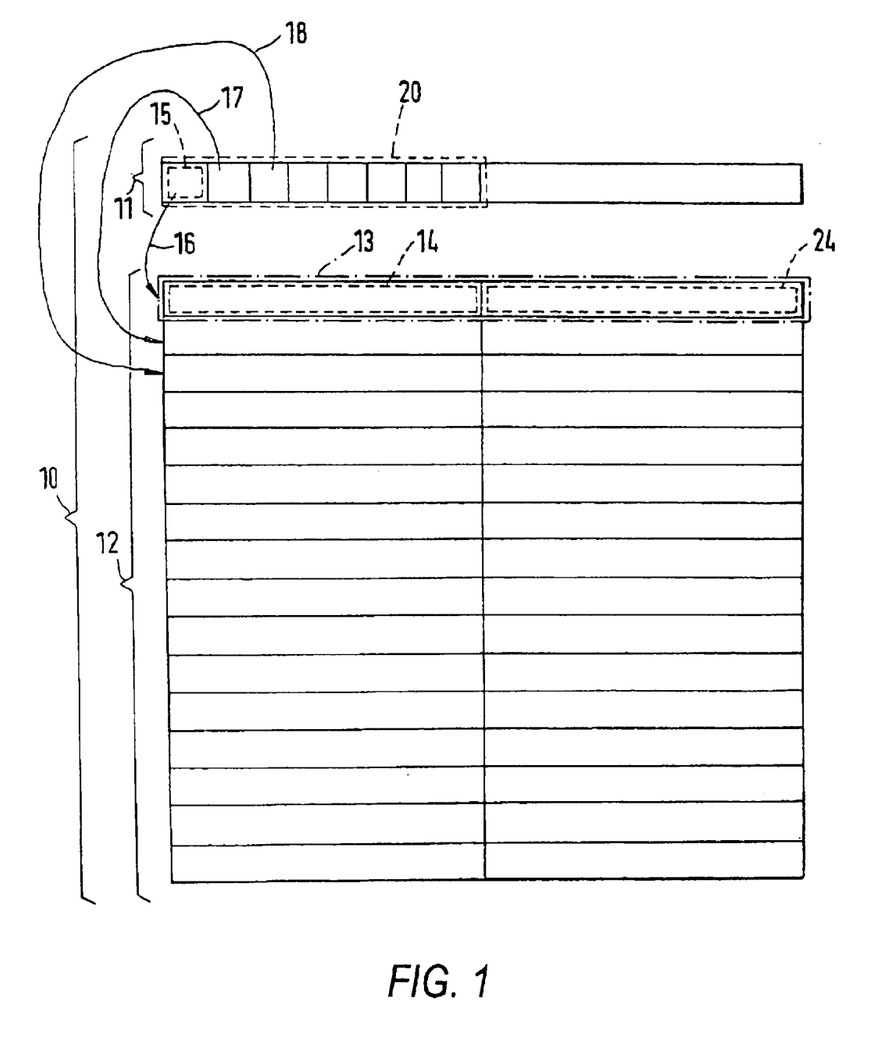
FIG. 1 shows a structure of a data packet according to the invention.

FIG. 1 shows a data packet 10 which contains data that have been compressed in the manner according to the invention. The embodiment of the data packet in FIG. 1 is an example for the structure of a stored data packet 10. The data packet 10 has a first region 11 and a second region 12. The second region 12 is comprised of at least one word 13. A word 13 is comprised of a first data element 14 and a second data element 24. For the depiction in FIG. 1, a word 13 with two data elements 14 and 24 in the second region 12 has been highlighted.

In the exemplary embodiment, the first region 11 is also comprised of one word with two data elements. The data elements can thus be divided into base elements. In FIG. 1, a data element 20 is shown divided into a number of individual base elements 15. A base element 15 is highlighted in the drawing by means of a dashed frame. Each base element 15 of the data elements in the first region 11 is clearly associated with a word 13 in the second region 12. By way of example, the Fig. shows three associations 16, 17, 18 between base elements in the first region 11 and words in the second region 12. The association between the highlighted base element 15 and the highlighted word 13 is explained below: depending on the value of the base element 15, the associated word 13 is in a compressed or uncompressed form. If it is in the uncompressed form, then the two data elements 14, 24 of the associated word 13 are uncompressed data elements of a sequence of data elements which was initially to have been compressed. However, if the word 13 is in a compressed form, then the associated first data element 14 contains a repetition factor for how often the second data element 24 should now be repeated in a decompression aimed at restoring the original data sequence.

The data elements in the first region 11 and the second region 12 are preferably similar and the same size. However, this is not absolutely necessary. Thus for example, the data elements in the second region can be divided into base elements differently than those in the first region 11.

Figure 2:
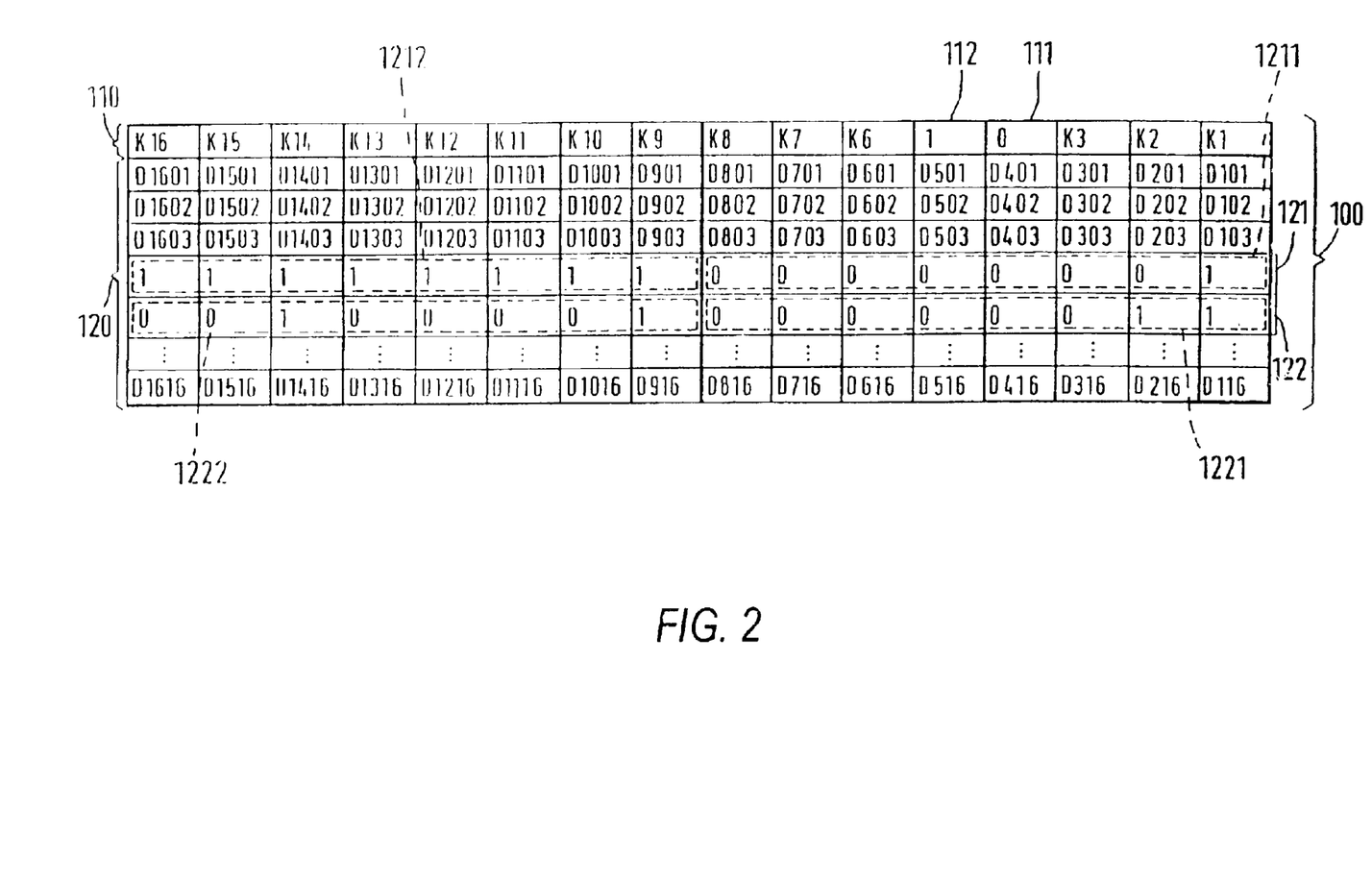
FIG. 2 shows an embodiment of a data packet according to the invention.

FIG. 2 shows a data packet 100 which represents a particular embodiment of the data packet 10 from FIG. 1. The data packet has a first region 110 and a second region 120. The first region 110 and the second region 120 are each comprised of similar words, all of which are in turn comprised of two respective data elements. The data elements associated with one word are disposed next one another in the figure. Each data element is in turn comprised of eight bits. Each bit can either assume the value "0" or "1".

In the exemplary embodiment, the first region 110 is comprised of precisely one word. The second region contains 16 words, all of which are not shown in the Fig. for the sake of clarity. When their value is not explicitly indicated, the bits in the first region 110 are indicated with the labels K1 to K16 and the bits in the second region are indicated with labels between D101 and D1616. The last two positions of the labels D101 to D1616 relate to an association with one of the bits K1 to K16. The value of these bits can arbitrarily be either "1" or "0".

A first base element 111 in the first region 110 is explicitly indicated, with an associated first word 121 in the second region 120, which word has a first data element 1211 and a second data element 1212. In addition, a second base element 112 in the first region is explicitly indicated, with an associated second word 122 from the second region 120, which word has a first data element 1221 and a second data element 1222.

The individual bits of a data element, for example of the second data element 1222, can be interpreted as individual digits of a binary number. Thus clearly each data element can be associated with a whole number in the range from zero to 255 ($255=2^8-1$). The second data element 1222 can therefore be clearly associated with the number 33.

Furthermore, it is possible in turn to associate this number with a graphic character or a screen character, for example by means of the ASCII code, the ANSI code, or any other code.

In the exemplary embodiment selected, the base element 111 in the first region 110 now has a value zero. In the selected exemplary embodiment, this means that the associated word 121 is understood to be uncompressed. This means that the data elements 1211 and 1212 are not compressed. During the restoring of the data sequence in the context of a decompression of the data packet 100, at this point, the data element 1211 with the value 1, or 00000001 as a binary number, is now added to the data sequence that has been produced thus far. Then the data element 1212 with the value 255, or 11111111 as a binary number, is added to the data sequence produced thus far.

In the selected exemplary embodiment, the second base element 112 has the value 1. The second word 122 is thus understood to be compressed. In this case, the second data element 1222 predetermines the repetition factor for the first data element 1221. Since the second data element 1222 is associated with the value 33, this means that during decompression of the data, the first data element 1221 must be added 33 times to the partial sequence produced up to this point. Then the process is continued with the base element labeled K6 in the first region 110 and the associated word, which is not shown in the drawing, until the data packet has been completely processed and the original data sequence has been restored.

It is likewise possible to consider the first data element 1221 as a repetition factor for the second data element 1222. This must be clearly established before a compression and decompression.

Figure 3:
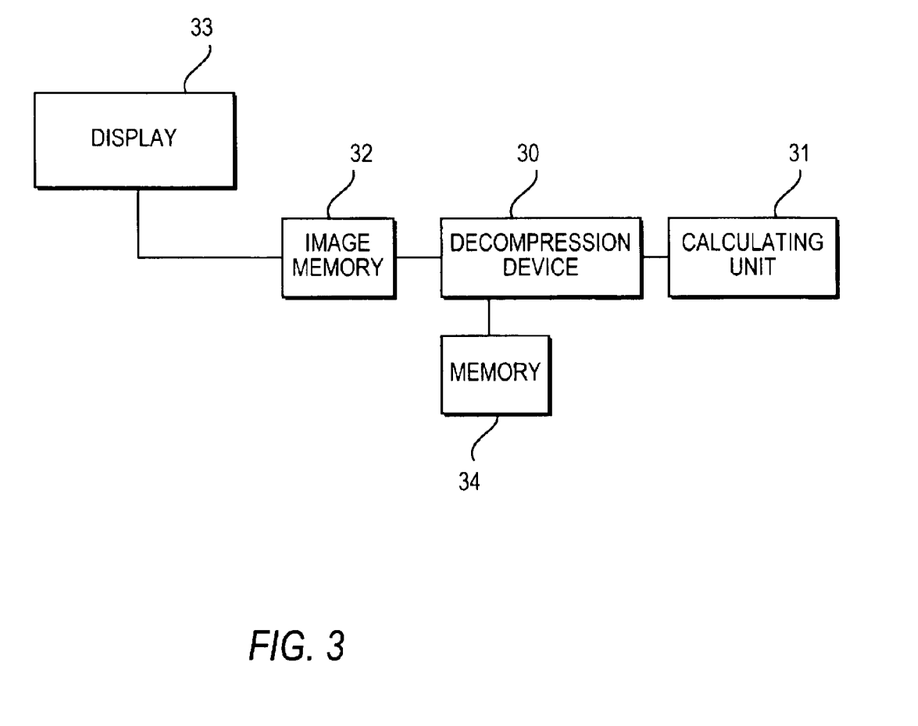
FIG. 3 shows a decompression device according to the invention, with a display device connected to it and a calculating unit.

FIG. 3 shows a decompression device 30 with which the method according to the invention can be executed, in connection with a calculating unit 31, a memory 34, an image memory 32, and a display unit 33. This selected exemplary embodiment can preferably be used in a motor vehicle and is used in particular for displaying operating data of the vehicle. By means of sensors and measuring instruments that are not shown, the calculating unit 31 determines the engine speed, the cooling water temperature, and/or the vehicle speed, for example. The calculating unit then causes a display image to be output, for example, a display image of a speedometer that corresponds to the vehicle speed detected by the sensors. The output takes place in such a way that the calculating unit 31 sends the decompression unit 30 an instruction to decompress the appropriate image from the memory 34 and to store it in the image memory 32. The image memory 32 is queried at predetermined time intervals by the display unit 33, which causes the image data stored in the image memory 32 to be displayed on the display unit 33. The display is preferably a liquid crystal display, but can also be a CRT (cathode ray tube) or an FED (field emission display). Whereas the image memory 32 is preferably a volatile memory, the memory 34 is a non-volatile memory such as a semiconductor component with permanently stored data or a magnetic and/or optical data storage device. The decompression device 30 is preferably embodied as a semiconductor component or as a part of a semiconductor component with a permanently stored program. It can be embodied as either a microcontroller or a microprocessor.

Figure 4:
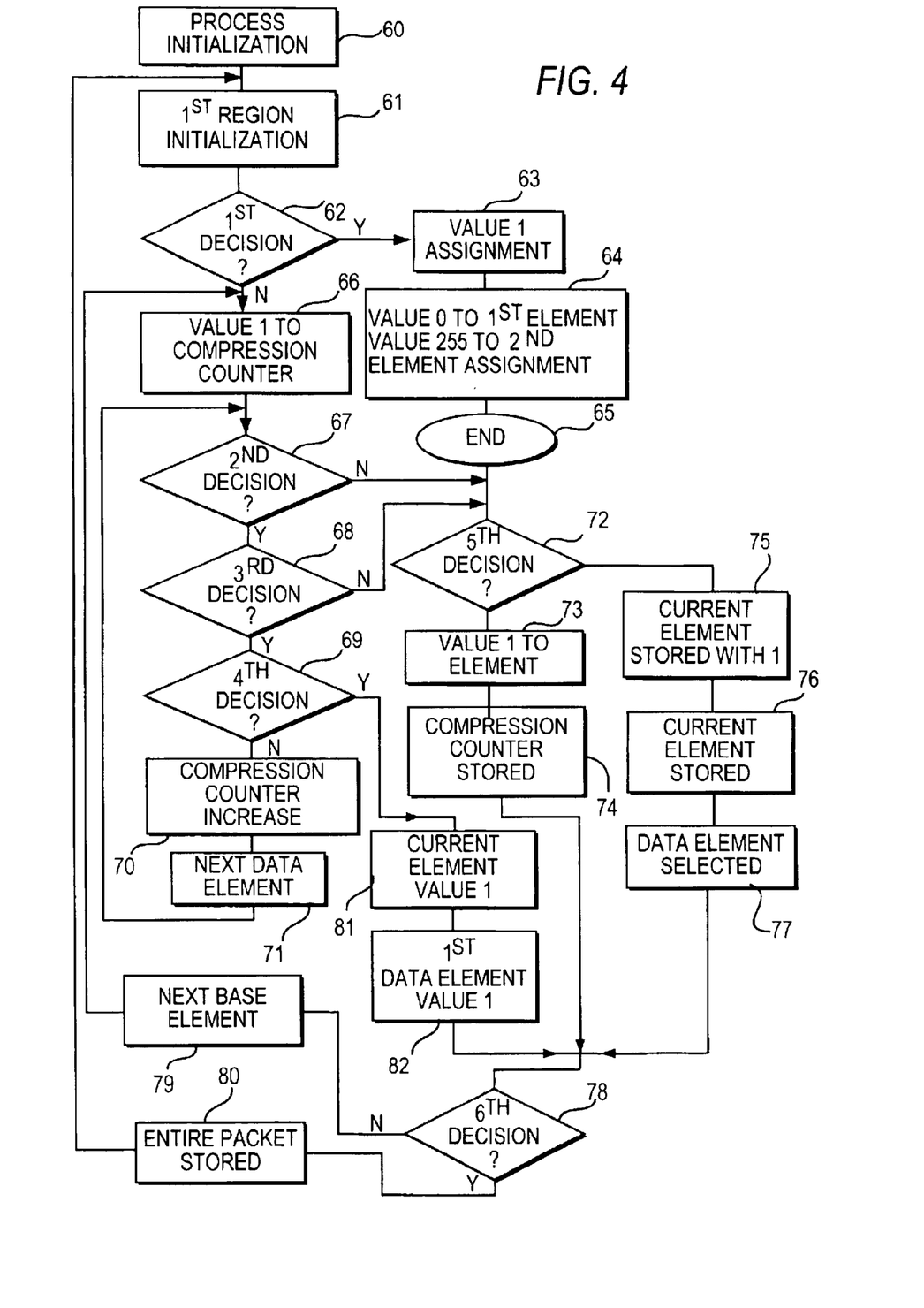
FIG. 4 shows a course of the method according to the invention for compressing a sequence of data elements.

FIG. 4 shows a method according to the invention for a compression of data from a data sequence. In a first step 60, the process is initialized and the data sequence is supplied for processing. The data sequence is thus in a form in which there is a clear order of data elements. In a subsequent, second process step 61, a new, first region of a data packet is initialized. Also, a first data element of the data sequence is established as a current data element. In addition, a first base element in the first region of the new data packet is established as a current base element. In a subsequent, first decision step 62, a check is made as to whether the end of the data sequence has been reached. If the end of the data sequence has been reached, then the process continues along the path marked y to a process step 63. In the process step 63, the base elements in the first region which have not yet been assigned any value are assigned the value 1. In the subsequent process step 64, the words associated with these base elements, in the first data element, in which the repetition factor for the second data element is stored, are assigned the value zero and the second data element is assigned the value 255. In a concluding step 65, the process is ended and the then completed data packet is to be stored. The assignment in process step 64 is selected in such a way that the corresponding data elements are labeled as having been stored in compressed form and consequently, the data element which corresponds to the value 255 is repeated zero times. During decompression, a check can be made at this point as to whether the data packet was correctly completed in this storage operation or whether a possible corruption of the data file has occurred. In lieu of the value 255, an arbitrary value can also be selected for the second data element since this data element does not appear in the decompression of the data sequence. Thus in the last word of the last data packet of a compressed data sequence, for example, the total number of data packets which make up an image can be stored at this point.

If the end of the data sequence has not yet been reached in the first decision step 62, then the process continues along the path n. In a subsequent process step 66, a compression counter is then assigned the value 1. The compression counter serves to determine the number of times an element is repeated in succession in the data sequence. In a subsequent, second decision step 67, a check is made as to whether the current data I element is identical to a subsequent data element in the data sequence. If this is the case, then the process follows the path y to a subsequent, third decision step 68. In the third decision step 68, a check is made as to whether the compression counter is lower than 255. If this is the case, then the process continues along the path y and in a subsequent, fourth decision step 69, a check is made as to whether the data element after the next in the data sequence is the last data element in the data sequence. If this is not the case, then the process moves from the fourth decision step 69 along the path n to process step 70. In the process step 70, the compression counter is increased by 1. Furthermore, in a subsequent process step 71, the next data element in the data sequence is established as the current data element. Then the process is continued with the second decision step 67.

If, in the second decision step 67, the next data element following in the data sequence after the current data element is not equal to the current data element or if, in the third decision step 68, the compression counter has a value greater than 255, then the process is continued with a fifth decision step 72. In the fifth decision step 72, a check is made as to whether the compression counter has a value greater than 1. If this is the case, then in a process step 73, the current base element in the first region of the data packet has the value 1. In a subsequent process step 74, the value of the compression counter in the first data element is stored in the word associated with the base element in the second region of the data packet and the current data element of the data sequence is stored in the second data element of the associated word. Then the process moves to a sixth decision step 78. If the compression counter does not have a value greater than 1, then the current base element from the fifth decision step 72 is stored with the value 0 in a process step 75. In a subsequent process step 76, the current data element of the data sequence is stored in the first data element of the word associated with the base element stored in the process step 75. The next data element of the data sequence is stored in the second data element of the same word. In a subsequent process step 77, the data element after the next is selected as the current data element. Then the process likewise moves on to the sixth decision step 78.

The sixth decision step 78 is likewise reached when, in the fourth decision step 69, it is determined that the data element after the next, starting from the current data element, is the last in the data sequence. Before the decision step 78 is reached, in this instance starting from the fourth decision step 69, the current base element in the first region of the data packet is initially set to the value 1 in a process step 81. In a process step 82 subsequent to this process step 81, before the sixth decision step 78 is reached, in the associated word, the value 1 is stored in the first data element and the data element of the data sequence in the queue for storage is stored in the second data element. Then the process likewise moves to the sixth decision step 78 in which a check is made as to whether the data packet is now completely full. If this is not the case, then the path n is selected and the process moves to a process step 79 in which the next base element following the current base element is established as the current base element in the first region of the data packet. Then the process moves on to the process step 66. By contrast, if it is determined in the sixth decision step 78 that the data packet is completely full, then the path y is followed and the entire data packet is stored in a process step 80. Then the process moves on to the process step 61 and a subsequent data packet is filled.

Figure 5:
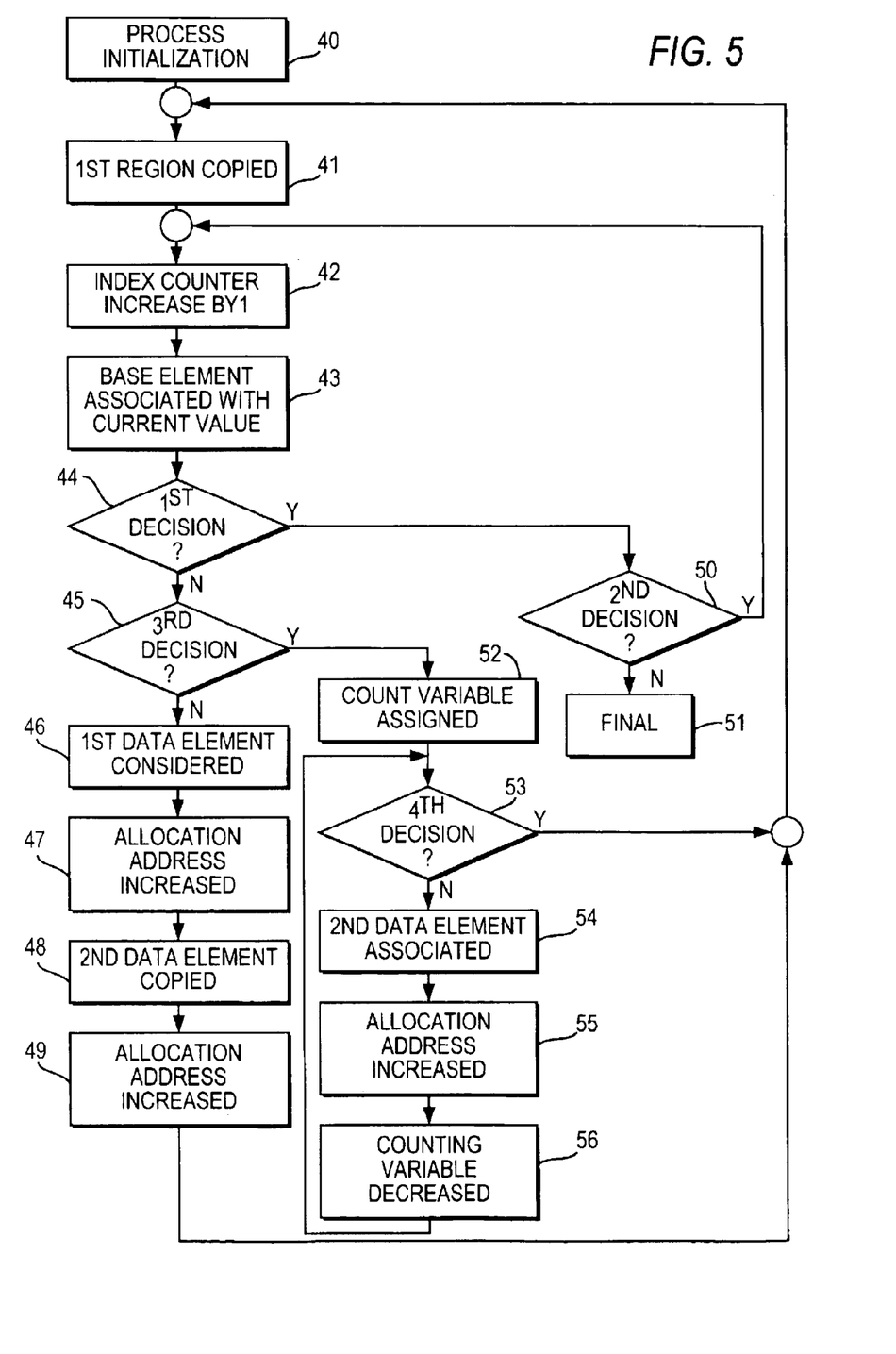
FIG. 5 shows a course of the method according to the invention for decompressing a data packet.

FIG. 5 shows a method according to the invention for decompressing a data packet. In a first process step 46, the process is initialized and a data packet is transmitted. In a subsequent, second process step 41, the first region of the data packet is copied in a memory of the decompression unit and a reference to the first region of the data packet is produced, which is stored in the memory 34. In addition, an index counter is set to zero. Each value of the index counter that is greater than zero is associated with a data element in the first region of the data packet. The base element which corresponds to the respective existing value of the index counter is the respective current data element. In a subsequent, third process step 42, the index counter is increased by 1. In a subsequent process step 43, the base element that is associated with the current value of the index counter and is from the first region of the data packet and the associated word, i.e. the two data elements of the word, are copied into the memory, if such a base element or word exists; the memory is advantageously associated with the decompression device 30. In a subsequent, first decision step 44, a check is made as to whether the index counter has exceeded the maximal number of base elements per data element. If this is the case, then the process moves along the path y to a second decision step 50. Here, a check is made as to whether there are other data packets. This can, for example, by means of a reference, appended to each data packet, to a subsequent data packet, for cases in which there is such a data packet. For cases in which there is no such data packet, a reference to an empty data packet is also possible. If there is another data packet, then the process moves back to the second process step 41 (path y from the second decision step 50). If there is no other data packet, then the process moves from the second decision step 50 along the path n, to a final step 51. The data sequence is thus completely decompressed and is disposed in a temporary storage. If the data sequence represents a compressed image, then this temporary storage is the image memory 32 of the display unit 33.

If it is determined in the first decision step 44 that the index counter has not yet exceeded the maximal number of base elements, then from there, the process follows the path n to a third decision step 45. In this third decision step 45, a check is made as to which value the current base element has. For the case in which it has a value of zero, the process moves along the path n to a process step 46. In this process step 46, the first data element of the word associated with the current base element is considered to be an element of the originally compressed sequence and is added to a partial sequence which has been decompressed up to this point. If the data elements relate to image data, then the first data element of the word associated with the base element is copied into the image memory 32 of the display unit. Subsequently, in a process step 47, an allocation address for the image memory is increased so that subsequent data elements are written into the image memory at a subsequent point. In a subsequent process step 48, the second data element of the word associated with the current base element is copied into the image memory. Then, in a process step 49, the allocation address for the image memory 32 is likewise increased again. Then, the process continues with the second process step 42. If, in the third decision step 45, it is determined that the current base element has the value 1, then the process moves along the path y to a process step 52. In this process step 52, a count variable is assigned the value of the first data element of the word associated with the current base element. In a subsequent, fourth decision step 53, a check is made as to whether the counting variable has the value zero. If the counting variable does have the value zero, then the process follows the path y and as after the process step 49, the process is continued with the third process step 42. If the counting variable has a value not equal to zero, then the process moves along the path n from the fourth decision step 53. In a process step 54, the second data element of the word associated with the base element is copied into the image memory. In a subsequent process step 55, the allocation address of the image memory 32 is increased. In an additional process step 56, the counting variable is decreased by 1. Then the process is continued with the fourth decision step 53.

What is claimed is:

1. A method of compressing a sequence of data elements, comprising the steps of storing data elements in a compressed or uncompressed form depending on a correlation with the data elements preceding or following the data elements in a sequence; providing at least one additional data element in which is stored an information as to whether the stored data elements are stored in a compressed or uncompressed form; storing in a first region the data element in which is stored information as to which data elements are stored in a compressed or uncompressed form; and storing in a second storage region the compressed or uncompressed date elements.

2. A method as defined in claim 1; and further comprising processing the sequence of data elements in a predeterminable order, in which successive elements are checked as to whether they are identical.

3. A method as defined in claim 1; and further comprising occurring a compression of the data element in such a way that data element which occur several times in succession are counted and are stored with a repetition factor.

4. A method as defined in claim 1; and further comprising storing the sequence, in the sequences of data element which exceed a predeterminable number of data elements, in a number of data packets wherein each data packet is comprised of at least two data elements.

5. A method for decompressing a sequence of data elements, from a data packet, comprising the steps of comprising a data packet of data elements in a first region and a second region of the data packet; generating a sequence of data elements as a function of the data elements stored in the first region, from the data elements stored in the second region, with or without decompression; and processing the data elements and base elements in a predetermined sequence respectively associating each base element of the data elements stored in the first region with two data elements stored in the second region; if a base element has a first value, not occurring a compression of the data element; if the base element has a second value not occurring a decompression.

6. A method as defined in claim 5; and further comprising, depending on the data elements present in the second region of the data packet and the first base element of a predetermined partial sequence to be processed according to a predetermined order which is an empty partial sequence, adding data elements; continuing generating the partial sequence for each additional base element to be processed as a function of the data element present in the second region of the data packet until a termination criterion is fulfilled.

7. A method as defined in claim 6; and further comprising, for the case in which no decompression occurs, adding a data element to the partial sequence unchanged.

8. A method as defined in claim 6; and further comprising occurring a decompression in such a way that a first, predetermined data element associated with a base element is established as a repetition factor for a second, predetermined data element associated with the base element; and adding the second data element to the partial sequence in accordance with the repetition factor.

9. A method as defined in claim 6; and further comprising executing a decompression on a data sequence comprised of a number of concatenated or successive data packets.

10. A method as defined in claim 6; and further comprising connecting a device to a calculating unit and a display device; depending on information transmitted by the calculating unit, decompressing at least partially compressed sequences of data elements.

11. A method as defined in claim 10; and further comprising transmitting a consequently generated image data to the display device.

12. A method as defined in claim 11, wherein said transmitting Includes transmitting via an image memory.

13. A method as defined in claim 10; and further comprising operating the device for compressing part of a freely programmable combination instrument.

* * * * *